(12) United States Patent
Rhee et al.

(10) Patent No.: US 8,295,106 B2
(45) Date of Patent: Oct. 23, 2012

(54) DELAY LOCKED LOOP AND METHOD AND ELECTRONIC DEVICE INCLUDING THE SAME

(75) Inventors: Woogeun Rhee, Beijing (CN); Xueyi Yu, Beijing (CN); Joon-Young Park, Seoul (KR); Zhihua Wang, Beijing (CN)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 345 days.

(21) Appl. No.: 12/781,800

(22) Filed: May 17, 2010

(65) Prior Publication Data

US 2010/0302885 A1  Dec. 2, 2010

(30) Foreign Application Priority Data

May 29, 2009  (KR) .................. 10-2009-0047747

(51) Int. Cl.
*G11C 7/00* (2006.01)
(52) U.S. Cl. .................. 365/194; 365/233.11; 327/158
(58) Field of Classification Search .................. 365/194, 365/233.11; 327/156, 158
See application file for complete search history.

(56) References Cited

U.S. PATENT DOCUMENTS

| | | | |
|---|---|---|---|
| 6,822,483 B1 | 11/2004 | Fu et al. | |
| 7,138,845 B2 | 11/2006 | Lin | |
| 7,388,795 B1 * | 6/2008 | To et al. | 365/194 |
| 2006/0097762 A1 * | 5/2006 | Jeon | 327/156 |
| 2008/0075222 A1 | 3/2008 | Lee et al. | |
| 2008/0100356 A1 | 5/2008 | Lee | |

FOREIGN PATENT DOCUMENTS

| | | |
|---|---|---|
| JP | 2008-099303 | 4/2008 |
| JP | 2008-109663 | 5/2008 |
| KR | 10-2007-0045276 | 5/2007 |
| KR | 10-2008-0028341 | 3/2008 |
| KR | 10-2008-0037233 | 4/2008 |

OTHER PUBLICATIONS

Yu, et al. "A Semi-Digital Cascaded CDR With Fast Phase Acquisition and Adaptive Resolution Control". Apr. 26, 2010.

* cited by examiner

*Primary Examiner* — Huan Hoang
(74) *Attorney, Agent, or Firm* — Muir Patent Consulting, PLLC

(57) ABSTRACT

A delay locked loop and method and electronic device including the delay locked loop are provided. In one embodiment, the delay locked loop includes a first delay locked loop and a second delay locked loop. The first delay locked loop receives a data signal and a plurality of first clock signals, generates a plurality of second clock signals based on interpolation on the plurality of first clock signals, selects and outputs one of the second clock signals from among the plurality of second clock signals based on a locking operation on the plurality of second clock signals and the data signal, and generates a plurality of phase resolution control signals. The second delay locked loop receives the data signal, the selected second clock signal, and the plurality of phase resolution control signals, generates a plurality of third clock signals having variable phase resolution based on the selected second clock signal and at least one of the plurality of phase resolution control signals, and performs a locking operation on the plurality of third clock signals and the data signal.

20 Claims, 6 Drawing Sheets

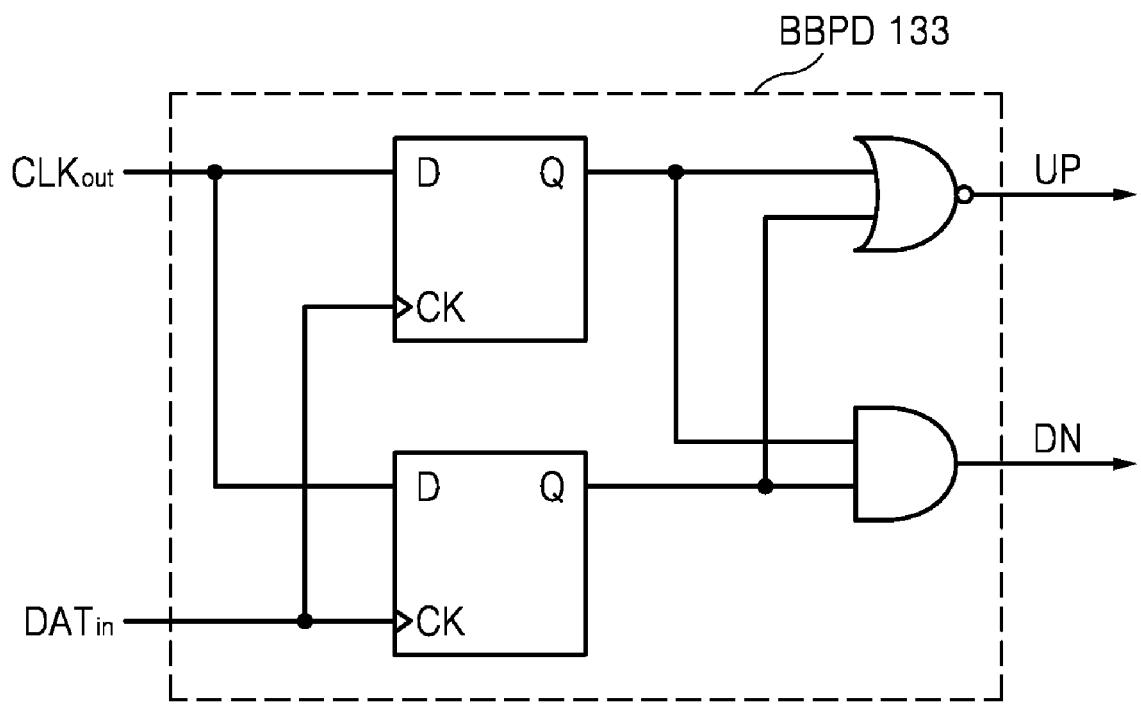

DELAY LOCKED LOOP AND METHOD AND ELECTRONIC DEVICE INCLUDING THE SAME

CROSS-REFERENCE TO RELATED APPLICATIONS

This application claims priority under 35 U.S.C. §119 to Korean Patent Application No. 10-2009-0047747 filed on May 29, 2009, in the Korean Intellectual Property Office, the disclosure of which is incorporated herein by reference.

BACKGROUND

This application relates to a delay locked loop, and more particularly, to a delay locked loop having a precise phase resolution and a precise phase locking range.

Clock and data recovery (CDR) based on a delay locked loop, especially CDR using a phase interpolator does not use a voltage controlled oscillator (VCO) and thus has the following advantages. First, the CDR using a phase interpolator is robust to power supply voltage noise because no jitter accumulation takes place. Second, the CDR using a phase interpolator is easily designed and has low power consumption because the CDR does not require a VCO at each link in applications using a multi-link. Third, the CDR using a phase interpolator requires only a small area, is easy to design, and is robust to power, voltage, temperature (PVT) variation because the CDR uses a digital loop filter.

However, in the CDR using a phase interpolator, algorithmic jitter takes place and there is a limit to realizing a high phase resolution. Moreover, trade-off between phase resolution and phase locking time occurs. In other words, when the phase resolution increases, the phase locking time also increases. When the phase resolution decreases, the phase locking time also decreases. In addition, since the CDR using a phase interpolator is a first-order feedback system, trade-off between phase resolution and frequency locking range also takes place.

SUMMARY

Some disclosed embodiments provide a delay locked loop for reducing locking time and maintaining a high phase resolution and an electronic device including the same.

According to one embodiment, a delay locked loop is provided. The delay locked loop includes a first delay locked loop and a second delay locked loop. The first delay locked loop may receive a data signal and a plurality of first clock signals, generate a plurality of second clock signals based on interpolation on the plurality of first clock signals, select and output one of the second clock signals from among the plurality of second clock signals based on a locking operation on the plurality of second clock signals and the data signal, and generate a plurality of phase resolution control signals. The second delay locked loop may receive the data signal, the selected second clock signal, and the plurality of phase resolution control signals, generate a plurality of third clock signals having variable phase resolution based on the selected second clock signal and at least one of the plurality of phase resolution control signals, and perform a locking operation on the plurality of third clock signals and the data signal.

According to another embodiment, a method of performing delay locking on a first input signal and a second input signal is disclosed. The method includes performing coarse locking on the first input signal and second input signal using a first delay locked loop and a coarse phase resolution, and based on the coarse locking, outputting from the first delay locked loop a third signal and a fourth signal to a second delay locked loop. The third signal may be a signal coarsely locked with the first input signal, and the fourth signal may be a first phase resolution control signal. The method also includes receiving the first input signal, the third signal, and the fourth signal at the second delay locked loop, and based on the received fourth signal, performing, by the second delay locked loop, fine locking on the first input signal and the third signal using a fine phase resolution. The method additionally includes outputting from the second delay locked loop a fifth signal that is finely locked with the first input signal.

According to another embodiment, an electronic device is disclosed. The electronic device may be a semiconductor device. In one embodiment, the electronic device includes a first delay locked loop and a second delay locked loop. The first delay locked loop is configured to perform coarse locking on the first input signal and second input signal using a coarse phase resolution, and based on the coarse locking, output a third signal and a fourth signal to a second delay locked loop. The third signal may be a signal coarsely locked with the first input signal, and the fourth signal may be a first phase resolution control signal. The second delay locked loop is configured to receive the input signal, the third signal, and the fourth signal, based on the received fourth signal, perform fine locking on the first input signal and the third signal using a fine phase resolution, and output a fifth signal that is finely locked with the first input signal.

BRIEF DESCRIPTION OF THE DRAWINGS

The above and other features and advantages disclosed herein will become more apparent by describing in detail exemplary embodiments thereof with reference to the attached drawings in which:

FIG. 2B is a circuit diagram of another exemplary phase detector according to certain disclosed embodiments;

DETAILED DESCRIPTION

Figure 1:
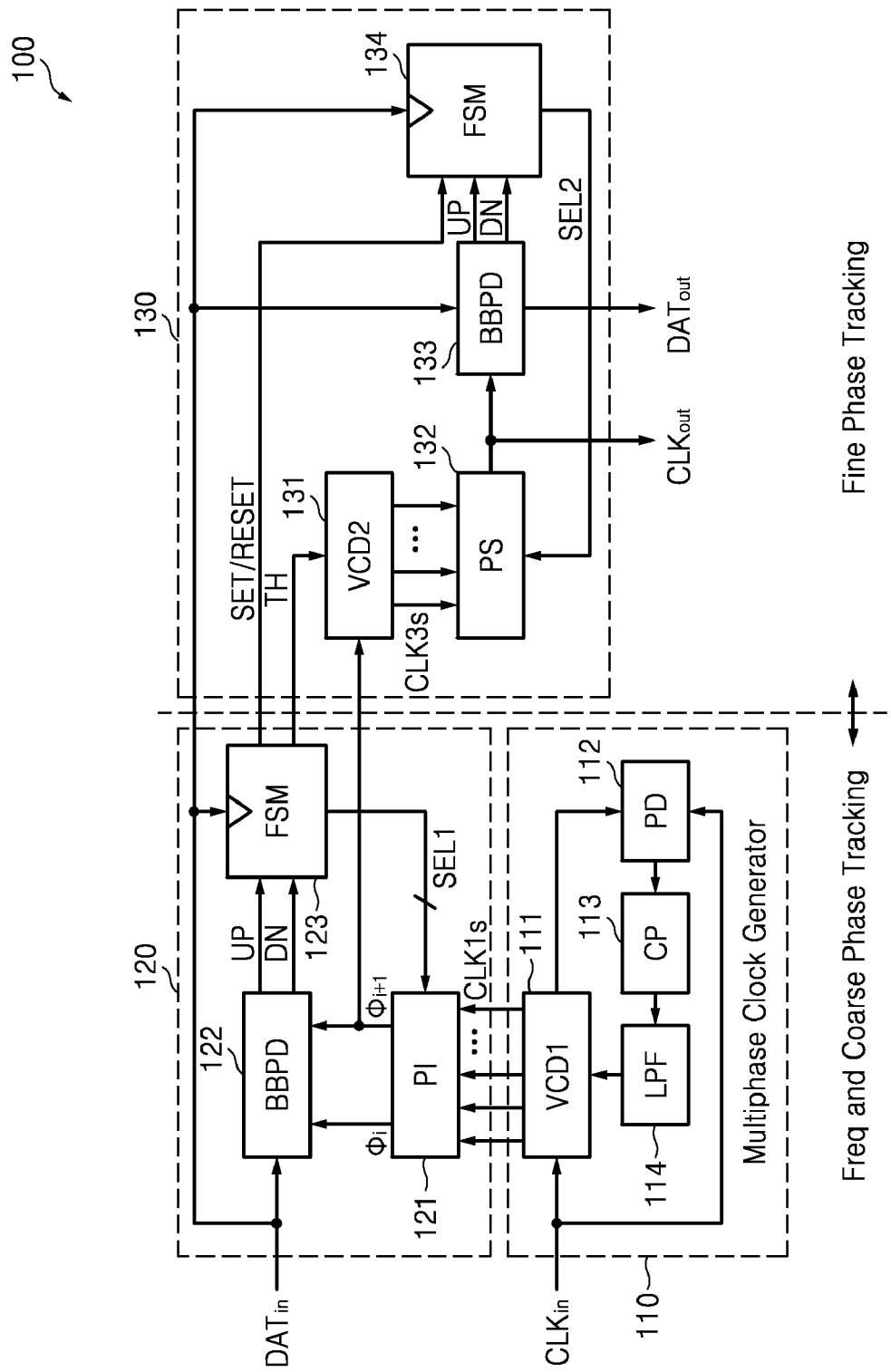
FIG. 1 is a block diagram of an exemplary delay locked loop according to certain disclosed embodiments.

Various embodiments now will be described more fully hereinafter with reference to the accompanying drawings. However, the disclosed embodiments may be embodied in many different forms and should not be construed as limited to the embodiments set forth herein. Rather, these embodiments are provided so that this disclosure will be thorough and complete, and will fully convey the scope of the methods and systems disclosed herein to those skilled in the art. In the drawings, the size and relative sizes of elements and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure. As another example, a first signal and second signal could be the same signal, unless indicated otherwise.

The terminology used herein is for the purpose of describing particular embodiments only and is not intended to limit the scope of the disclosure. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a delay locked loop 100 (DLL 100) according to an exemplary embodiment. The delay locked loop 100 includes a clock generator 110, a first delay locked loop 120 (DLL 120), and a second delay locked loop 130 (DLL 130).

The clock generator 110 receives an input clock signal $CLK_{in}$ and generates a plurality of first clock signals CLK1s having the same frequencies but different phases based on the input clock signal $CLK_{in}$. In one embodiment, the clock generator 110 includes a voltage controlled delay line 111, a phase detector 112, a charge pump 113, and a loop filter 114. However, clock generators for generating a plurality of clock signals are generally known, so details of the above elements 111-114 are not described herein, and other elements could alternatively be used by clock generator 110 to generate multiple clock signals.

In one embodiment, first clock signals CLK1s include a set of signals having the same frequency as $CLK_{in}$, but progressively delayed when compared to $CLK_{in}$. For example, each successive signal can be delayed 1/X of a cycle more than the previous signal, such that the phase resolution of DLL 120 is 1/X of a cycle (e.g., CLK1s could include 32 different CLK1 signals, each being delayed 1/32 of a signal cycle more than the previous signal, or could include other numbers of signals, such as 2, 4, 8, 16, etc.).

The first delay locked loop 120 receives data $DAT_{in}$ and the first clock signals CLK1s, generates a plurality of second clock signals (e.g., $\Phi_i$ and $\Phi_{i+1}$) based on interpolation of the first clock signals CLK1s, and performs a locking operation on the second clock signals and the data $DAT_{in}$ to cause the second clock signals to be closer in phase with the $DAT_{in}$ clock signal (e.g., to have rising edges closer to the rising edges of the $DAT_{in}$ signal), thus performing coarse phase locking. Although only two second clock signals $\Phi_i$ and $\Phi_{i+1}$ are illustrated in FIG. 1, the number of second clock signals is not limited thereto.

More specifically, the first delay locked loop 120 includes a phase interpolator 121, a first phase detector 122, and a first controller (e.g., finite state machine, or "FSM") 123. The phase interpolator 121 receives the first clock signals CLK1s and generates a plurality of second clock signals. For example, in one embodiment, phase interpolator 121 may be initially set to select two clock signals from the plurality of first clock signals CLK1s. The initial two selected signals (e.g., $\Phi_i$ and $\Phi_{i+1}$), may be, for example, two signals from the plurality of first clock signals CLK1 having the most delay, two having the least delay, or two signals in the middle. In one embodiment, the two selected signals are two consecutive signals, such that they have a phase difference of only one incremental step (e.g., the incremental step could be 1/32 of a cycle, such that $\Phi_i$ has a first phase, and $\Phi_{i+1}$ has a phase delayed 1/32 of a cycle behind $\Phi_i$). In one embodiment, the selected second clock signals $\Phi_i$ and $\Phi_{i+1}$ are sent to first phase detector 122.

The first phase detector 122 generates first phase control signals UP and DN based on the data $DAT_{in}$ and the second clock signals $\Phi_i$ and $\Phi_{i+1}$. As illustrated in FIG. 1, the first phase detector 122 may be implemented by a bang bang phase detector (BBPD) which generates the first phase control signals UP and DN based on whether the phase of the data $DAT_{in}$ leads that of each of the second clock signals $\Phi_i$ and $\Phi_{i+1}$.

Figure 2A:
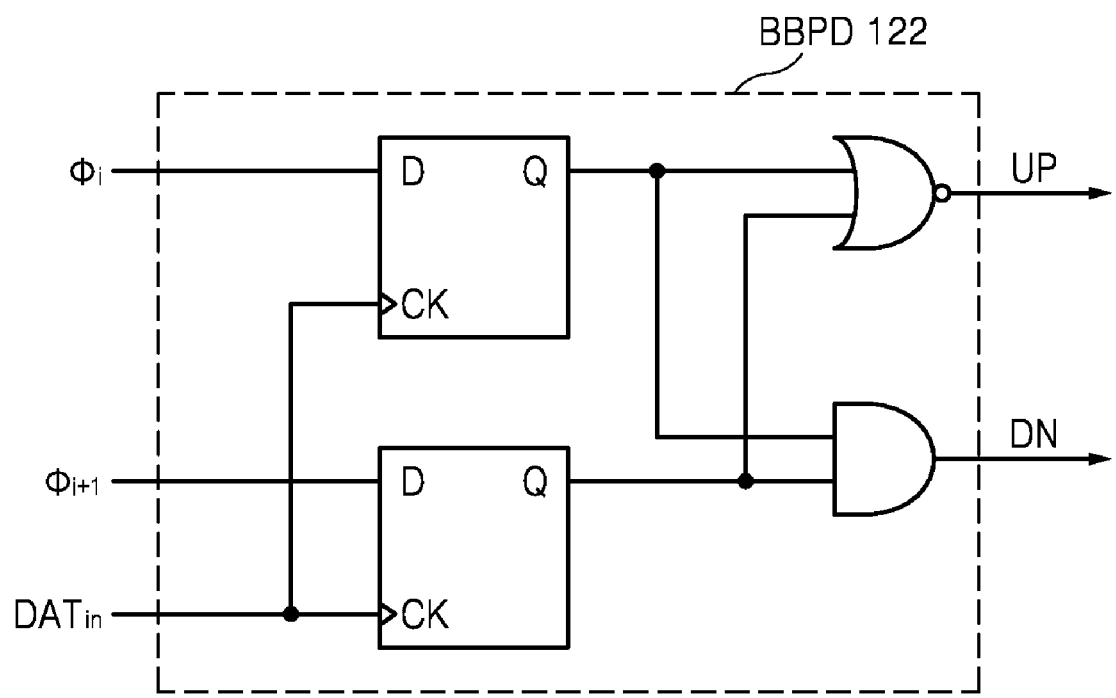
FIG. 2A is a circuit diagram of an exemplary phase detector according to certain disclosed embodiments.

An exemplary bang bang phase detector 122 is depicted in FIG. 2A. As shown in FIG. 2A, BBPD 122 receives data $DAT_{in}$ and second clock signals $\Phi_i$ and $\Phi_{i+1}$ as inputs. If the phases of both of second clock signals $\Phi_i$ and $\Phi_{i+1}$ are behind the phase of $DAT_{in}$ (e.g., rising edges of $\Phi_i$ and $\Phi_{i+1}$ are delayed up to 50% of a cycle behind the rising edge of $DAT_{in}$) then BBPD 122 outputs a logical 1 for UP and a logical 0 for DN. Conversely, if the phases both of second clock signals $\Phi_i$ and $\Phi_{i+1}$ are ahead of the phase of $DAT_{in}$ (e.g., rising edges of $\Phi_i$ and $\Phi_{i+1}$ are ahead up to 50% of a cycle of the rising edge of $DAT_{in}$), then BBPD 122 outputs a logical 0 for UP and a logical 1 for DN. If the phase of one of second clock signals $\Phi_i$ and $\Phi_{i+1}$ is ahead of the phase of the data $DAT_{in}$ signal and the phase of the other second clock signal is behind the phase of the data $DAT_{in}$ signal (e.g., when the rising edge of $DAT_{in}$ falls between the rising edge of $\Phi_i$ and the rising edge of $\Phi_{i+1}$), then both the UP and DN output is a logical 0.

Returning to FIG. 1, based on the value of UP and DN, FSM 123 outputs a value for a first selection signal SEL1. In one embodiment, when UP is 1 and DN is 0, FSM outputs a value for SEL1 for the next loop of the DLL 120 that causes phase interpolator 121 to select second clock signals $\Phi_i$ and $\Phi_{i+1}$ that are both one step less delayed than the second clock signals $\Phi_i$ and $\Phi_{i+1}$ sent to BBPD 122 in the previous loop. Conversely, when UP is 0 and DN is 1, FSM outputs a value for SEL1 for the next loop that causes phase interpolator 121 to select second clock signals $\Phi_i$ and $\Phi_{i+1}$ that are both one step more delayed than the second clock signals $\Phi_i$ and $\Phi_{i+1}$ sent to BBPD 122 in the previous loop. When both UP and DN are 0, then FSM outputs the same select signal value for SEL1 as in the previous loop, because the second clock signals $\Phi_i$ and $\Phi_{i+1}$ are considered to be coarsely locked with the $DAT_{in}$ signal.

In one embodiment, first clock signals CLK1s and second clock signals $\Phi_i$ and $\Phi_{i+1}$ may have a different frequency (e.g., a slightly larger or smaller frequency) than the $DAT_{in}$ signal. In this case, even after coarse locking, the rising edges of second clock signals $\Phi_i$ and $\Phi_{i+1}$ continue to shift in one direction or the other (e.g., to be more delayed than rising edges of $DAT_{in}$ or to be less delayed). As such, both UP and DN will remain 0 until the second clock signals $\Phi_i$ and $\Phi_{i+1}$ shift enough so that both of them are either more delayed than or are ahead of $DAT_{in}$, at which point, either UP changes to 1 or DN changes to 1. In this situation, in one embodiment, FSM 123 counts the average number "N" of transitions (e.g., rising edges) of the $DAT_{in}$ signal that occur during the period where UP and DN are both 0. This number may then be used to determine a first phase resolution control signal TH value sent to DLL 130, which is used to control the phase resolution of DLL 130. In one embodiment, the TH value is a binary value of 1, 2, 4, 8, 16, or 32, and the value of TH is set to be the highest of these values that is less than the number of transitions N. In addition, FSM 123 is configured to output a second phase resolution control signal SET/RESET when either of UP or DN changes from 0 to 1.

Although not shown in FIG. 1, the first controller 123 may include a digital loop filter (e.g., a loop filter logic), which performs filtering in response to the first phase control signals UP and DN. When the digital loop filter is used, the delay locked loop 100 becomes dull to power, voltage, temperature (PVT) variation and easy to design.

In one embodiment, the first delay locked loop 120 selects and outputs one of the second clock signals $\Phi_i$ or $\Phi_{i+1}$ (e.g., $\Phi_{i+1}$) to send to clock generator 131 of second delay locked loop 130. In addition, as discussed above and further below, FSM 123 generates a plurality of phase resolution control signals (e.g., TH and SET/RESET) which are sent to and control the phase resolution and operation of the second delay locked loop 130. The first phase resolution control signal TH may set the phase resolution of the second delay locked loop 130 to be higher than that of the first delay locked loop 120. For instance, a clock generator 131 included in the second delay locked loop 130 may generate the third clock signals CLK3s having a less phase difference between each other than a phase difference between the second clock signals $\Phi_i$ and $\Phi_{i+1}$ in response to the first phase resolution control signal TH. As such, the first delay locked loop 120 may perform frequency locking and coarse phase locking and the second delay locked loop 130 may perform fine phase locking, so that the delay locked loop 100 completes locking to a high phase resolution in a short locking time.

The second delay locked loop 130 receives the data $DAT_{in}$, the selected second clock signal (e.g., $\Phi_i$ or $\Phi_{i+1}$), and the phase resolution control signals TH and SET/RESET, generates a plurality of third clock signals CLK3s having different phases based on the selected second clock signal and the phase resolution control signals TH and SET/RESET, performs delay locking on the third clock signals CLK3s and the data $DAT_{in}$, and outputs an output clock signal $CLK_{out}$ and output data $DAT_{out}$. In one embodiment, the output clock signal $CLK_{out}$ is a third clock signal CLK3 that has the least phase difference with the data $DAT_{in}$ among the third clock signals CLK3s. The output data $DAT_{out}$ may be the data $DAT_{in}$ input.

In one embodiment, the second delay locked loop 130 includes the clock generator 131, a phase selector 132, a second phase detector 133, and a second controller 134. The clock generator 131 controls the phase resolution of the third clock signals CLK3s based on the selected second clock signal ($\Phi_i$ or $\Phi_{i+1}$) in response to the first phase resolution control signal TH and generates the plurality of third clock signals CLK3s. Accordingly, because first phase resolution control signal TH depends on the first delay locked loop 120, resolution of the third clock signals CLK3s is controlled based on a result of the delay locking operations of the first delay locked loop 120. For example, in an embodiment where the phase resolution of the first DLL 120 is 2*pi/32 (e.g., 1/32 of a clock cycle), where the number of transition (N) of $DAT_{in}$ during the coarse locked state of DLL 120 is 10, TH may be set to 8, such that the phase resolution of the CLK3 signals is in 1/(32*8) (i.e. 1/256) of a cycle increments. As such, if $\Phi_{i+1}$ is sent to clock generator 131, then the CLK3 signals could include 8 signals each spaced 1/256 of a cycle apart, such that together they cover an entire resolution step of DLL 120 (e.g., 1/32 of a cycle).

The clock generator 131 may be implemented by a voltage controlled delay (VCD) line including a plurality of delay elements, which control the amount of phase delay with respect to the selected second clock signal in response to the first phase resolution control signal TH to generate the plurality of third clock signals CLK3s. However, the scope of the disclosed embodiments are not restricted thereto. Alternatively, when two or more clock signals are received from the first delay locked loop 120, the clock generator 131 may be implemented by a phase interpolator, which generates a plurality of clock signals based on interpolation of the two or more received clock signals.

The phase selector 132 selects and outputs one clock signal from among the plurality of third clock signals CLK3s in response to a second selection signal SEL2 received from the second controller 134. For example, the second selection signal SEL2 may indicate which of the third clock signals CLK3 should be sent to phase detector 133.

The phase selector 132 then outputs the selected output clock signal to second phase detector 133. Second phase detector 133 receives the selected output clock signal and the $DAT_{in}$ signal, and compares the two signals to generate second phase control signal UP or DN based on a phase difference between the data $DAT_{in}$ and the output clock signal $CLK_{out}$. The second phase detector 133 may be implemented by a BBPD which generates the second phase control signals UP and DN based on whether the phase of the data $DAT_{in}$ leads that of the output clock signal $CLK_{out}$.

An exemplary embodiment of a second phase detector 133 is shown in FIG. 2B. As shown, BBPD 133 receives data $DAT_{in}$ and the clock signal $CLK_{out}$ (signal output from phase selector 132) as inputs. If the phase of the clock signal $CLK_{out}$ is behind the phase of $DAT_{in}$ (e.g., rising edges of $CLK_{out}$ are delayed up to 50% of a cycle behind the rising edge of $DAT_{in}$) then BBPD 133 outputs a logical 1 for UP and a logical 0 for DN. Conversely, if the phase of the clock signal $CLK_{out}$ is ahead of the phase of $DAT_{in}$ (e.g., rising edges of $CLK_{out}$ are ahead up to 50% of a cycle of the rising edge of $DAT_{in}$), then BBPD 133 outputs a logical 0 for UP and a logical 1 for DN.

In one embodiment, when UP is 1 and DN is 0, FSM 134 outputs a second phase control signal value for SEL2 for the next loop of the DLL 130 that causes phase selector 132 to select a clock signal $CLK_{out}$ that is one step less delayed than the clock signal $CLK_{out}$ sent to BBPD 133 in the previous loop. Conversely, when UP is 0 and DN is 1, FSM 134 outputs a select signal value for SEL2 for the next loop that causes phase selector 132 to select a clock signal $CLK_{out}$ that is one step more delayed than the clock signal $CLK_{out}$ sent to BBPD 133 in the previous loop.

In one embodiment, the SET/RESET signal can be one of three values: SET, RESET, or locked. When DLL 120 is in the coarse locked state, as discussed above, the SET/RESET signal has the locked value. When DLL 120 outputs an UP signal after being in the locked state (e.g., UP changes from 0 to 1), then the SET/RESET signal can be changed to SET, which, for example, instructs FSM 134 to output a value for SEL2 that selects the most delayed of the CLK3 signals.

Conversely, when DLL 120 outputs a DN signal after being in the locked state (e.g., DN changes from 0 to 1), then the SET/RESET signal can be changed to RESET, which, for example, instructs FSM 134 to output a value for SEL2 that selects the least delayed of the CLK3 signals. As such, the second controller 134 initializes the phase information of the second delay locked loop 130 and effectively controls the direction of a locking operation on the data $DAT_{in}$ and the third clock signals CLK3s in response to the second phase resolution control signal SET/RESET generated in response to the change in the phase of the first delay locked loop 120.

Because the delay locked loop 100 performs a locking operation (e.g., coarse delay locking) using the phase interpolator 121, jitter accumulation does not take place, and therefore, the delay locked loop 100 is robust to power supply voltage noise. As a result, it is not necessary to provide a voltage controlled oscillator (VCO) at every link in a multi-stage DLL circuit, thereby facilitating a design and reducing power consumption.

A procedure in which the first delay locked loop 120 controls the phase resolution of the second delay locked loop 130 will be described briefly. In general, when the phase resolution of the first delay locked loop 120 is changed, the first phase resolution control signal TH is also changed, and therefore, the phase resolution of the second delay locked loop 130 is changed. To perform phase locking with the changed phase resolution, the second controller 134 of the second delay locked loop 130 controls the second selection signal SEL2. In one embodiment, as discussed above and below, the second phase resolution control signal SET/RESET generated in response to coarse locking of the first delay locked loop 120 can control the initial setting of the FSM 134 and thus the selection of one of the third clock signals CLK3s.

For instance, when the phase resolution of the first delay locked loop 120 is 2*pi/32, and the first phase resolution control signal TH is a binary number corresponding to 1, 2, 4, 8, 16, or 32, the resolution of the second delay locked loop 130 may be set to 2*pi/32, 2*pi/64, 2*pi/128, 2*pi/256, 2*pi/512, or 2*pi/1024. Since the entire phase of the delay locked loop 100 is defined by the sum of the phase of the first delay locked loop 120 and the phase of the second delay locked loop 130, the phase of the signal output from the second delay locked loop 130 may be changed based on the change of the phase of the signal output from the first delay locked loop 120.

As an example, when the phase of the first delay locked loop 120 is 0 (e.g., $\Phi_{i+1}$ is in phase with $CLK_{in}$), and the phase resolution of the second delay locked loop 130 is 2*pi/128 (e.g., phase resolution of the first delay locked loop 120 could be 2*pi/32 and TH could be 4), the phase of the second delay locked loop 130 changes from 0 to 2*pi/128, (2*pi/128)*2, (2*pi/128)*3, and finally (2*pi/128)*4. Therefore, after four loops of delay locked loop 130, the delay due to DLL 130 is equal to the phase resolution of 2*pi/32 of the first delay locked loop 120. After this occurs, because of the phase tracking operation of first DLL 120, the phase resolution of the first delay locked loop 120 is changed to 2*pi/32 and the first controller 123 of the first delay locked loop 120 generates the second phase resolution control signal SET/RESET so that the second delay locked loop 130 can initialize the phase information associated with FSM 134 to "0" in response to the second phase resolution control signal SET/RESET. Thus, the entire phase of the delay locked loop 100 changes from 0+0 to 0+2*pi/128, 0+(2*pi/128)*2, 0+(2*pi/128)*3, 2*pi/32+0, 2*pi/32+2*pi/128, and so on. As such, the DLL 100 tracks $CLK_{in}$ so that $CLK_{out}$ is substantially in phase with $DAT_{out}$ (e.g., $DAT_{in}$). In the example above, the phase of the second delay locked loop 130 is increased from a minimum value while the locking operation is performed. However, the phase of the second delay locked loop 130 may alternatively be decreased from a maximum value during the locking operation, for example, based on the SET or RESET value, as discussed above.

The delay locked loop 130 may be packaged in package. For example, the package may be PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

Figure 3:
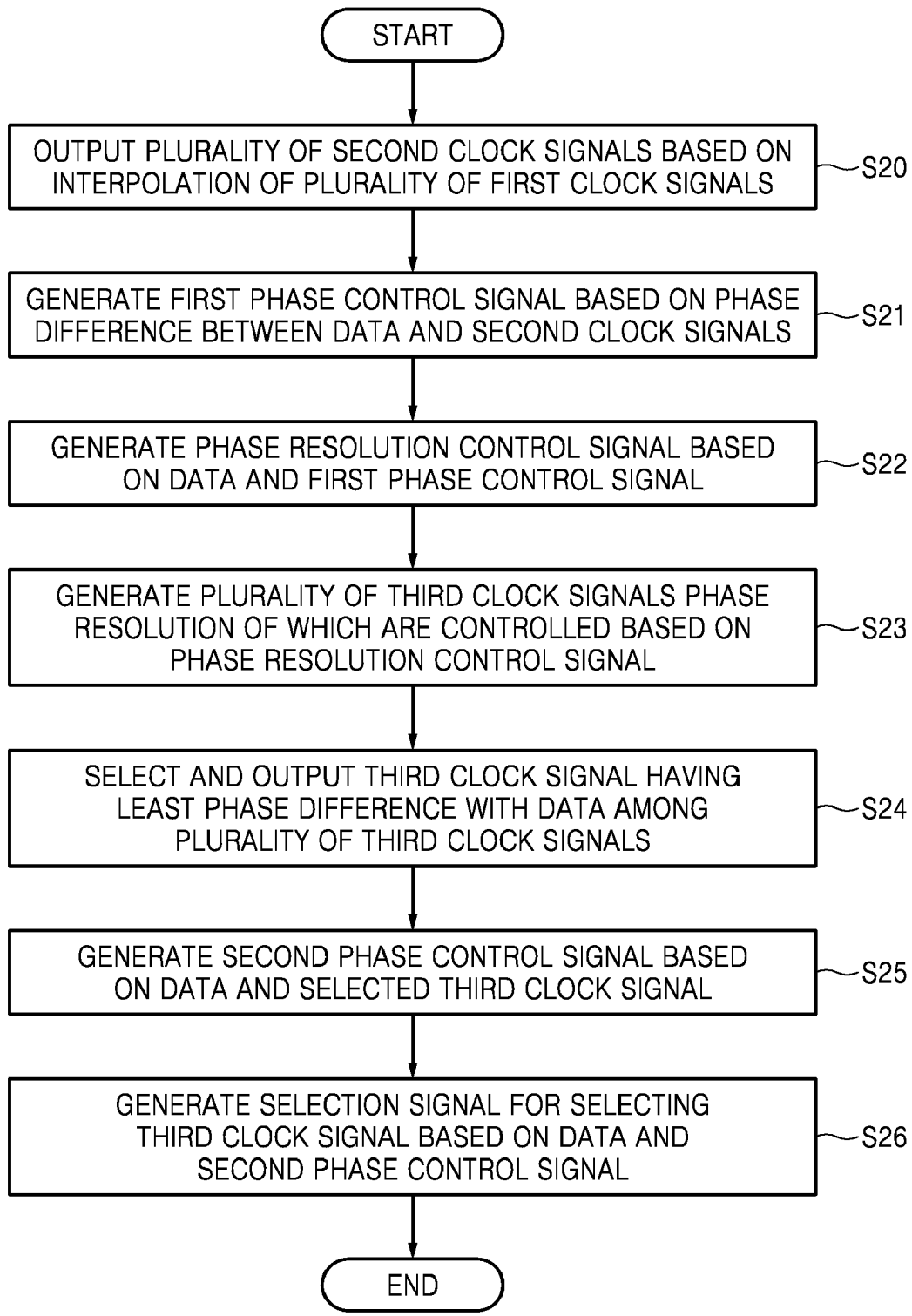
FIG. 3 is a flowchart of an exemplary method of driving a delay locked loop according to certain disclosed embodiments.

FIG. 3 is a flowchart of an exemplary method of driving the delay locked loop 100 according to certain disclosed embodiments. Referring to FIGS. 1 and 3, the phase interpolator 121 receives a plurality of the first clock signals CLK1s and outputs a plurality of the second clock signals (e.g., $\Phi_i$ and $\Phi_{i+1}$) based on the interpolation of the first clock signals CLK1s in step S20. The second clock signals ($\Phi_i$ and $\Phi_{i+1}$) are clock signals selected in response to the first selection signal SEL1 from among a plurality of clock signals generated by the phase interpolator 121.

The first phase detector 122 generates the first phase control signals UP and DN based on the phase differences between the data $DAT_{in}$ and the second clock signals $\Phi_i$ and $\Phi_{i+1}$ in step S21. The first controller 123 generates the first phase resolution control signal TH and the second phase resolution control signal SET/RESET based on the data $DAT_{in}$ and the first phase control signals UP and DN in step S22.

The clock generator 131 generates the third clock signals CLK3s the phase resolution of which are controlled based on the first phase resolution control signal TH in step S23. The phase selector 132 selects and outputs a third clock signal, i.e., the output clock signal $CLK_{out}$ that has the least phase difference with the data $DAT_{in}$ among the third clock signals CLK3s in step S24. The second phase detector 133 generates the second phase control signal UP or DN based on the data $DAT_{in}$ and the selected third clock signal $CLK_{out}$ in operation S25. Based on the data $DAT_{in}$ and the second phase control signal UP or DN, the second controller 134 generates the second selection signal SEL2 for selecting a third clock signal that has the least phase difference with the data $DAT_{in}$ among the third clock signals CLK3s in step S26.

The disclosed embodiments can also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. Also, functional programs, codes, and code segments to accomplish the present inventive concept can be easily construed by programmers skilled in the art to which the present inventive concept pertains.

Figure 4:
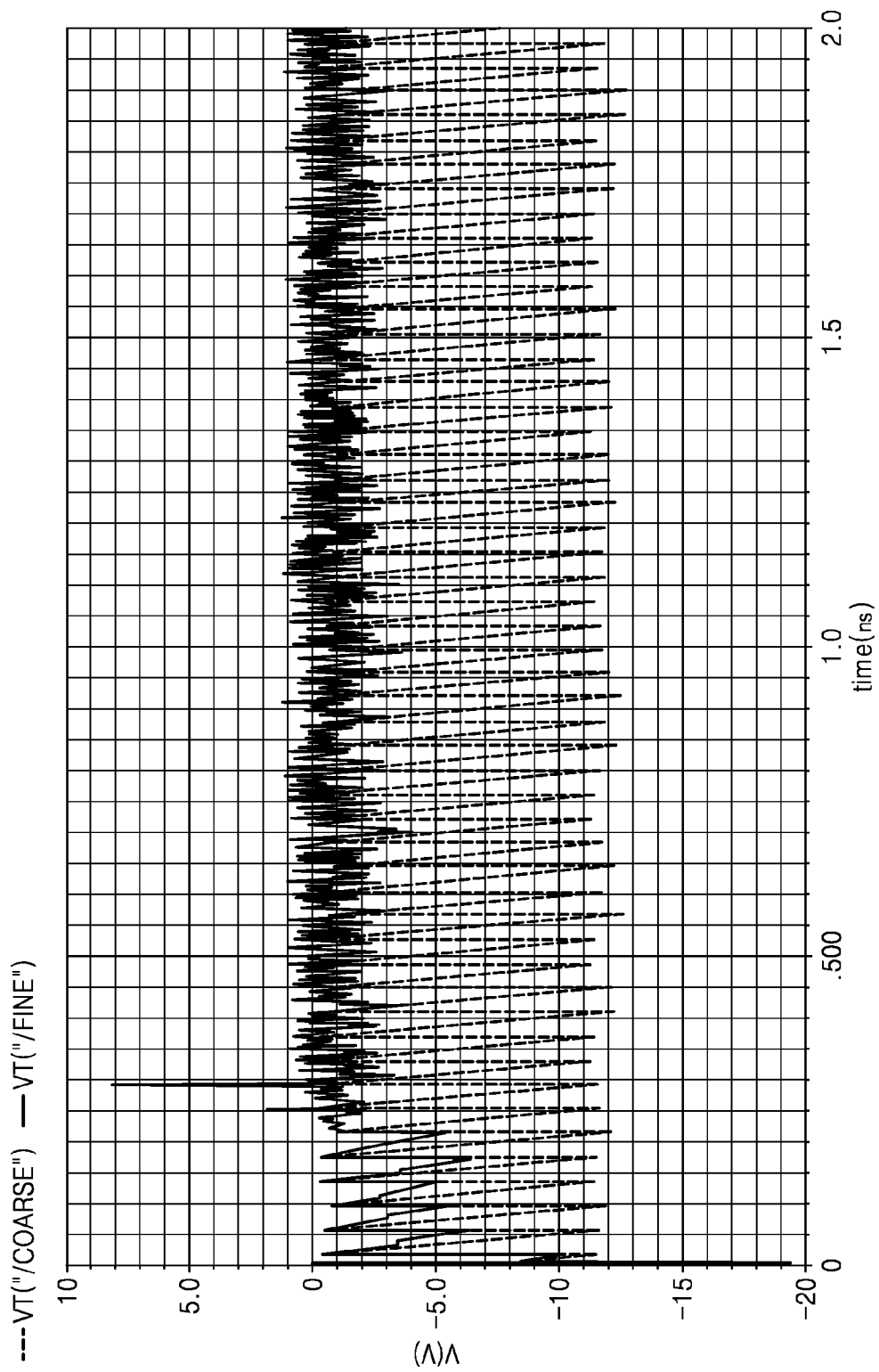
FIG. 4 is a graph showing phase error reduced after a locking operation is performed by a delay locked loop according to certain disclosed embodiments.

FIG. 4 is a graph showing phase error reduced after a locking operation is performed by the delay locked loop 100 in certain embodiments. The waveforms having the greater amplitude represent phase errors occurring after the first delay locked loop 120 performs frequency locking and coarse phase locking and the waveforms having the smaller amplitude represent phase errors occurring after the second delay locked loop 130 performs fine phase locking Referring to FIG. 4, the phase errors occurring after the fine phase locking of the second delay locked loop 130 are remarkably reduced compared to the phase errors occurring after the frequency locking and the coarse phase locking of the first delay locked loop 120.

Figure 5:
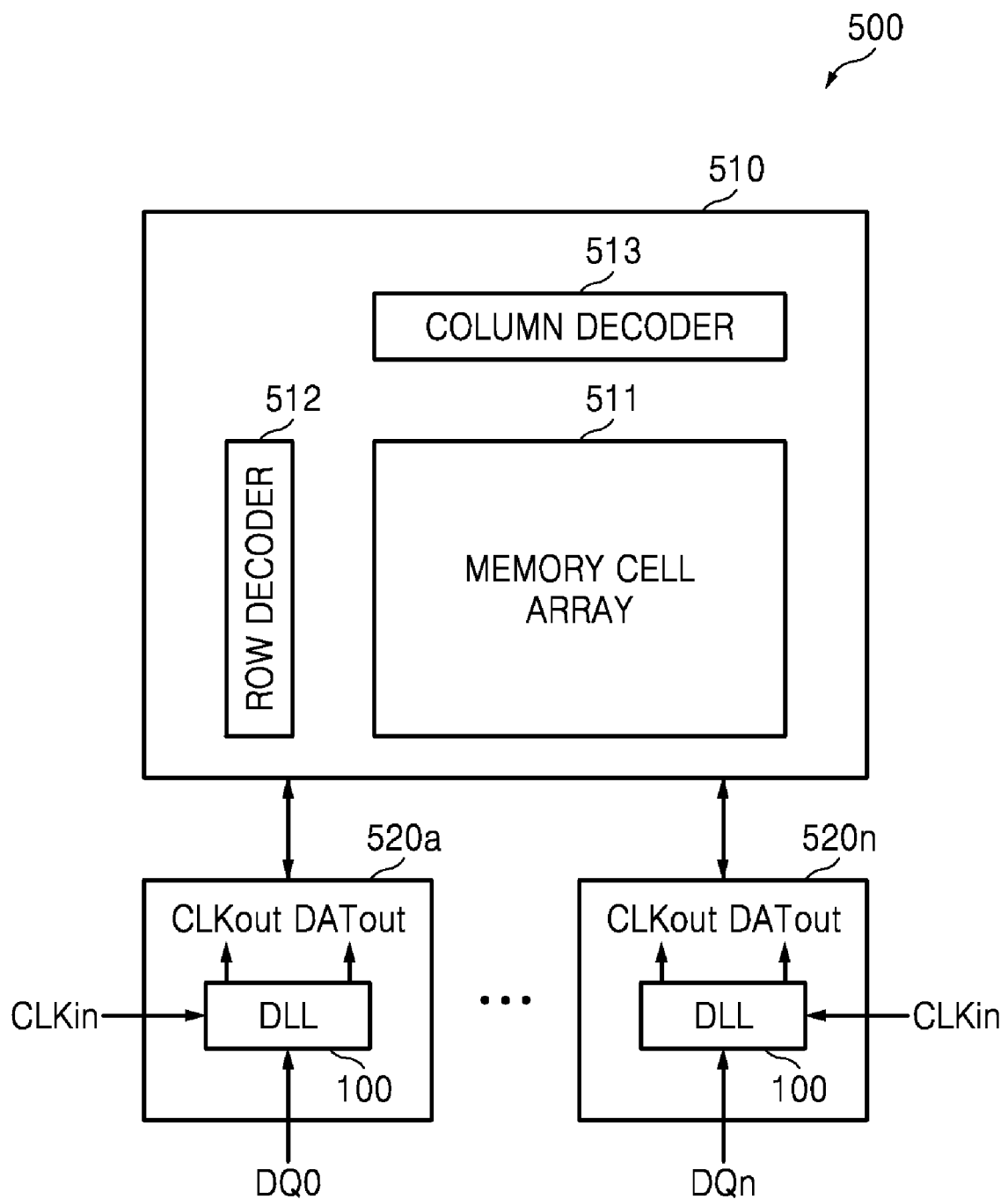
FIG. 5 is a block diagram of an exemplary semiconductor memory device according to certain disclosed embodiments.

FIG. 5 is a block diagram of a semiconductor memory device 500 according to certain embodiments. The semiconductor memory device 500 includes a plurality of input/output ports 520a through 520n each including the delay locked loop 100 and a memory core 510 including a memory cell array 511, a row decoder 512, and a column decoder 513. FIG. 5 is provided to illustrate the utilization of the delay locked loop 100 within the semiconductor memory device 500. Other elements such as a controller and a command included in the semiconductor memory device 500 are not shown in FIG. 5. Since the delay locked loop 100 has been described above with reference to FIGS. 1 through 4, detailed descriptions thereof will be omitted and the features of the semiconductor memory device 500 including the delay locked loop 100 will be described.

A system clock signal CLKin is provided to each of the input/output ports 520a through 520n. External input data DQ0 through DQn are respectively sampled by delay locked loops 100 included in the respective input/output ports 520a through 520n although they are not synchronized with the system clock signal CLKin. Sampled data DATout is transmitted to a data bus within the semiconductor memory device 500 directly or after being synchronized with the system clock signal CLKin. Here, the system clock signal CLKin corresponds to the input clock signal $CLK_{in}$ illustrated in FIG. 1, each of the input data DQ0 through DQn corresponds to the data $DAT_{in}$ illustrated in FIG. 1, and the sampled data DATout corresponds to the output data $DAT_{out}$ illustrated in FIG. 1.

It is seen from the above description that the recovered clock signal $CLK_{out}$ is used in sampling data. The recovered clock signal $CLK_{out}$ may also be transmitted to and used in other circuits within the semiconductor memory device 500 including the memory core 510.

The delay locked loop 100 is used to generate a timing signal in the semiconductor memory device 500 in the embodiments illustrated in FIG. 5, but the use of the delay locked loop 100 is not restricted to the current embodiments. It will be apparent to those of ordinary skill in the art that the delay locked loop 100 can be used in various types of electronic devices.

The delay locked loop 100 and/or the semiconductor memory device 500 according to some embodiments may be packed in various types of packages. For example, the various packages may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

As described above, according to some embodiments, a delay locked loop and an electronic device including the same have no jitter accumulation, high phase resolution, reduced frequency locking time, and reduced phase locking time and are efficient in multi-link applications are robust to PVT variation.

While this application has been particularly described with reference to exemplary embodiments thereof, it will be understood by those of ordinary skill in the art that various changes in forms and details may be made therein without departing from the spirit and scope of the disclosed embodiments, as defined by the following claims.

What is claimed is:

1. A delay locked loop comprising:
    a first delay locked loop configured to receive a data signal and a plurality of first clock signals, generate a plurality of second clock signals based on interpolation on the plurality of first clock signals, select and output one of the second clock signals from among the plurality of second clock signals based on a locking operation on the plurality of second clock signals and the data signal, and generate a plurality of phase resolution control signals; and
    a second delay locked loop configured to receive the data signal, the selected second clock signal, and the plurality of phase resolution control signals, generate a plurality of third clock signals having variable phase resolution based on the selected second clock signal and at least one of the plurality of phase resolution control signals, and perform a locking operation on the plurality of third clock signals and the data signal.

2. The delay locked loop of claim 1, wherein the first delay locked loop has a lower phase resolution than the second delay locked loop.

3. The delay locked loop of claim 1, wherein the first delay locked loop comprises:
    a phase interpolator configured to receive the plurality of first clock signals, perform interpolation of the first clock signals, and generate the plurality of second clock signals selected from among a plurality of clock signals generated based on the interpolation in response to a first selection signal;
    a first phase detector configured to generate a first phase control signal based on a phase difference between the data signal and each of the plurality of second clock signals; and
    a first controller configured to extract phase information of the first delay locked loop based on the data signal and the first phase control signal, and to generate the first selection signal, a first phase resolution control signal, and a second phase resolution control signal based on the phase information of the first delay locked loop.

4. The delay locked loop of claim 3, wherein the first phase detector generates the first phase control signal based on whether a phase of the data leads a phase of each of the plurality of second clock signals.

5. The delay locked loop of claim 3, wherein the second delay locked loop comprises:
    a clock generator configured to generate the plurality of third clock signals by controlling a phase resolution of the selected second clock signal in response to the first phase resolution control signal;
    a phase selector configured to select and output one clock signal from among the plurality of third clock signals in response to a second selection signal;
    a second phase detector configured to generate a second phase control signal based on a phase difference between the data and the selected third clock signal; and
    a second controller configured to extract phase information of the second delay locked loop based on the data signal and the second phase control signal and generate the second selection signal based on the phase information of the second delay locked loop.

6. The delay locked loop of claim 5, wherein the clock generator comprises a plurality of delay elements which control the amount of phase delay with respect to the selected second clock signal based on the first phase resolution control signal to generate the plurality of third clock signals.

7. The delay locked loop of claim 5, wherein the selected third clock signal is an output clock signal that has the least phase difference with the data signal among the plurality of third clock signals.

8. The delay locked loop of claim 5, wherein the second phase detector generates the second phase control signal based on whether a phase of the data signal leads a phase of the selected third clock signal.

9. The delay locked loop of claim 5, wherein the second controller controls the second selection signal in response to the second phase resolution control signal generated in response to a change of a phase of the first delay locked loop and controls a direction of the locking operation on the data and the plurality of third clock signals.

10. The delay locked loop of claim 1, wherein the first delay locked loop controls coarse locking on the data signal and plurality of first clock signals, and the second delay locked loop controls fine locking on the data signal and the selected second clock signal.

11. A method of performing delay locking on a first input signal and a second input signal, the method including:
 performing coarse locking on the first input signal and second input signal using a first delay locked loop and a coarse phase resolution;
 based on the coarse locking, outputting from the first delay locked loop a third signal and a fourth signal to a second delay locked loop, the third signal being a signal coarsely locked with the first input signal, and the fourth signal being a first phase resolution control signal;
 receiving the first input signal, the third signal, and the fourth signal at the second delay locked loop;
 based on the received fourth signal, performing, by the second delay locked loop, fine locking on the first input signal and the third signal using a fine phase resolution; and
 outputting from the second delay locked loop a fifth signal that is finely locked with the first input signal.

12. The method of claim 11, wherein the fine phase resolution is higher than the coarse phase resolution.

13. The method of claim 12, wherein the fine phase resolution is determined based on the fourth signal.

14. The method of claim 13, wherein the fourth signal is determined based on the coarse phase resolution.

15. The method of claim 14, wherein the fourth signal is further determined based on a frequency difference between the first input signal and the second input signal.

16. The method of claim 11, wherein the first input signal is a data signal and the second input signal is a clock signal.

17. The method of claim 16, wherein the fifth signal is a clock signal and the fifth signal is substantially in phase with the data signal.

18. The method of claim 17, wherein the data signal and the fifth signal are output to part of a semiconductor memory device.

19. An electronic device comprising:
 a first delay locked loop configured to:
  perform coarse locking on a first input signal and a second input signal using a coarse phase resolution, and
  based on the coarse locking, output a third signal and a fourth signal to a second delay locked loop, the third signal being a signal coarsely locked with the first input signal, and the fourth signal being a first phase resolution control signal;
 a second delay locked loop configured to:
  receive the first input signal, the third signal, and the fourth signal,
  based on the received fourth signal, perform fine locking on the first input signal and the third signal using a fine phase resolution, and
  output a fifth signal that is finely locked with the first input signal.

20. The electronic device of claim 19, wherein the electronic device is a semiconductor memory device and the fifth signal is output to a memory core of the semiconductor memory device.

* * * * *